US006717394B2

(12) United States Patent
Elms (10) Patent No.: US 6,717,394 B2
(45) Date of Patent: Apr. 6, 2004

(54) METHOD AND APPARATUS FOR DETERMINING FREQUENCY OF AN ALTERNATING CURRENT SIGNAL OF AN ELECTRIC POWER SYSTEM

(75) Inventor: Robert T. Elms, Monroeville, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 10/103,064

(22) Filed: Mar. 21, 2002

(65) Prior Publication Data

US 2003/0178982 A1 Sep. 25, 2003

(51) Int. Cl.[7] .......................... G01R 23/02; G01R 31/00
(52) U.S. Cl. ...................................... 324/76.39; 702/58
(58) Field of Search .............................. 324/76.39, 508, 324/520, 76.82, 76.42; 361/93.2; 702/58, 60, 199; 700/293, 292

(56) References Cited

U.S. PATENT DOCUMENTS

| | | | |
|---|---|---|---|
| 4,056,839 | A | 11/1977 | Andow |
| 4,246,623 | A | 1/1981 | Sun |
| 5,544,065 | A | 8/1996 | Engel et al. |
| 5,559,719 | A | 9/1996 | Johnson et al. |
| 5,822,165 | A | 10/1998 | Moran |
| 5,835,325 | A | 11/1998 | Tripodi et al. |
| 6,330,141 | B1 | 12/2001 | Elms |
| 6,519,537 | B1 * | 2/2003 | Yang ........................... 702/58 |

OTHER PUBLICATIONS

M. Begovic et al., "Frequency Tracking in Power Networks in the Presence of Harmonics", IEEE Transactions on Power Delivery, vol. 8, No. 2, Apr. 1993, pp. 480–486.

D. Member et al., "A New Frequency Tracking and Phasor Estimation Algorithm for Generator Protection", 96 SM 376–4 PWR, A paper recommended and approved by the IEEE Power System Relaying Committee of the IEEE Power Engineering Society for presentation at the 1996 IEEE/PES Summer Meeting, Jul. 28–Aug. 1, 1996, pp. 1–7.
T.S. Sidhu et al., "Am Iterative Technique for Fast and Accurate Measurement of Power System Frequency", PE–778–PWRD–0–04–1997, A paper recommended and approved by the IEEE Power System Relaying Committee of the IEEE Power Engineering Society for publication in the IEEE Transactions on Power Delivery, pp. 1–7.
A.G. Phadke et al., "A New Measurement Technique for Tracking Voltage Phasors, Local System Frequency, and Rate of Change of Frequency", IEEE Transactions on Power Apparatus and Systems, vol. PAS–102, No. 5, May. 1983, pp. 1025–1038.

* cited by examiner

*Primary Examiner*—Albert Decady
*Assistant Examiner*—James Kerveros
(74) *Attorney, Agent, or Firm*—Martin J. Moran (57) ABSTRACT

A protective relay determines frequency of an AC signal of an electric power system. The protective relay includes a circuit measuring the AC signal period between zero crossings to provide a measured period value. A microprocessor includes a random access memory having a five-element array, which collects five consecutive values of the measured period values. A microprocessor routine chooses a median from the measured period values and generally determines the frequency based upon the median. The median is ignored and the previously determined line cycle period is adjusted to determine the new line cycle period if: an absolute value of a difference between a last value of the measured period values and a previously determined line cycle period is not less than a predetermined value; and the last value of the measured period values is within the limits of the array.

28 Claims, 3 Drawing Sheets

| PERIOD (1) |
|---|
| PERIOD (2) |
| PERIOD (3) |
| PERIOD (4) |
| PERIOD (5) |
| PERIOD (6) |
| PERIOD (7) |

| PERIOD (1) |
|---|
| PERIOD (2) |
| PERIOD (3) |
| PERIOD (4) |
| PERIOD (5) |
| PERIOD (6) |

*FIG.4* ical noise
METHOD AND APPARATUS FOR DETERMINING FREQUENCY OF AN ALTERNATING CURRENT SIGNAL OF AN ELECTRIC POWER SYSTEM

BACKGROUND OF THE INVENTION

1. Field of the Invention

This invention relates to apparatus for monitoring and/or protecting alternating current (AC) electric power systems and, in particular, to apparatus, such as electronic protective relays, which provide on-line measurement of frequency of waveforms in such AC electric power systems. The invention also relates to a method for determining frequency of an AC signal of an electric power system.

2. Background Information

Frequency estimation is a very important function in power system protection. Frequency is not only an indication of power quality, but is also employed as a criterion for taking certain system control actions, such as load shedding. In addition, many protection functions and settings are based on the nominal frequency. In reality, power system frequency changes from time to time around the nominal value. Even through the variation from the nominal value is often very small, it may still make a significant difference in frequency-related applications. For instance, the voltage and current phasors, which are essential to implement many metering and relay functions, are obtained based on the nominal power frequency through use of Discrete Fourier Transform (DFT). A deviation from the nominal frequency will result in errors in both magnitude and phase of the phasor and, in turn, these errors will migrate into metering and relaying functions. If accurate frequency estimation could be obtained, then these errors would be minimized or eliminated.

The most popular methods for frequency measurement available today are the zero-crossing and DFT based techniques. As is well known, the accuracy of the zero-crossing method is influenced by harmonics but can be improved by using the least square technique or other noise-suppressing techniques. On the other hand, in the DFT based method, whether based on the magnitude or phase angle of a phasor, if all three-phase voltages are not available, then the estimated frequency will be oscillatory when the system frequency deviates from the nominal frequency. This oscillatory frequency is double the system frequency. The envelope of the estimated frequency increases with increasing deviation from the nominal frequency. Usually, the oscillatory frequency is smoothed through use of an average filter. However, with such a filter, the estimated frequency becomes stationary only at certain system frequencies while remaining oscillatory for other deviant system frequencies. It can be shown that with an average filter, the envelope of the estimated frequency will be a standing wave of increasing amplitude as the deviation from the nominal frequency increases. The standing points are dependent on the length of the average filter used. For instance, a two-cycle filter will result in three standing points at which the system frequencies are multiples of one-fourth the nominal frequency. This means that the estimation accuracy is system frequency dependent. An accurate frequency is only obtained at the standing points. An accurate estimation over a wide range of frequencies may be achieved by using adaptive approaches. These include the adaptive sampling period, the adaptive length of the data window, and adaptive filtering. Unfortunately, all of the adaptive approaches involve a considerable amount of computation in order to achieve better results.

A typical protective relay meters frequency and provides over/under frequency protection. Frequency is determined, for example, by employing a suitable measuring period (e.g., one or more line cycles) and by counting processor clocks between voltage zero crossings. However, electrical noise causes jitter on the zero crossings, thereby creating errors. Furthermore, averaging slows down the response time, although it improves accuracy.

There is a need therefore, for an improved apparatus for determining the frequency in an alternating current (AC) electric power system.

There is a further need for such an apparatus, which provides such an estimation of frequency with a consistent and predictable accuracy.

There is also a need for such an apparatus, which does not require excessive calculation, and can, therefore, provide an accurate estimation of frequency on-line with a reasonable computational burden and cost.

SUMMARY OF THE INVENTION

These needs and others are satisfied by the present invention, which is directed to an apparatus for providing an accurate on-line indication of frequency in an alternating current (AC) electric power system.

As one aspect of the invention, an apparatus determines frequency of an AC signal of an electric power system. The apparatus comprises means for measuring the period of the AC signal between one zero crossing and a subsequent zero crossing of the AC signal to provide a measured period value; and a processor comprising: a memory collecting at least five consecutive values of the measured period values, and a routine choosing a median value from the measured period values and determining the frequency based upon the median value.

The routine of the processor may further employ the median value to determine a new line cycle period if: (i) an absolute value of a difference between a last value of the measured period values and a previously determined line cycle period is less than a predetermined value; or (ii) the last value of the measured period values is greater than or equal to or less than or equal to all of the measured period values; and, otherwise, adjusts the previously determined line cycle period to determine the new line cycle period. The processor routine may predetermine the predetermined value from the previously determined line cycle period divided by a first constant minus a second constant.

As another aspect of the invention, a method for determining frequency of an AC signal of an electric power system comprises measuring the period of the AC signal between one of the zero crossings and a subsequent one of the zero crossings to provide a measured period value; collecting at least five consecutive values of the measured period values; choosing a median value from the consecutive values of the measured period values; and determining the frequency based upon the median value.

For example, statistical techniques are employed to measure the period of the line cycle by maintaining the last five line cycle period measurements, period(1), period(2), period (3), period(4), period(5), in a five-element array, period(n). In turn, the median value of the array is employed as the new line cycle period, $P_0$, in place of the old line cycle period, $P_{-1}$, if: (i) |last line cycle period measurement, period(1)−$P_{-1}$| is less than $P_{-1}/512-13$; or (ii) the period(1) is not within the limits (i.e., period(1) is greater than or equal to the maximum value, period(n)$_{MAX}$, of the array, or is less than or equal to the minimum value, period(n)$_{MIN}$, of the array) of the last five line cycle period measurements in the array.

As another aspect of the invention, a method for determining frequency of an AC signal of an electric power system comprises measuring the period of the AC signal between one of the zero crossings and a subsequent one of the zero crossings to provide a measured period value; collecting at least five of the measured period values; determining at least two highest values of the measured period values; determining at least two lowest values of the measured period values; and determining the frequency based upon the measured period values excluding the at least two highest values and the at least two lowest values.

The method may employ an odd count or an even count of the measured period values. For example, the method may employ five as the odd count of the measured period values, may determine a median value of the measured period values, and may determine the frequency based upon the median value.

The method may determine an average value of the measured period values excluding the two highest values and the two lowest values, and may determine the frequency based upon the average value.

The method may employ at least six as the even count of the measured period values, may determine two values closest to a median of the measured period values, may determine an average value of such two values, and may determine the frequency based upon such average value.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention has application generally to the determination of frequency in an alternating current (AC) power system and, particularly, to determining the frequency on-line. The invention is described as applied to a protective relay 5, although it will be apparent to those skilled in the art that it has numerous other applications such as, for example, other protective and/or monitoring devices, including, for example, circuit breakers, network protectors, analyzers and meters.

Figure 1:
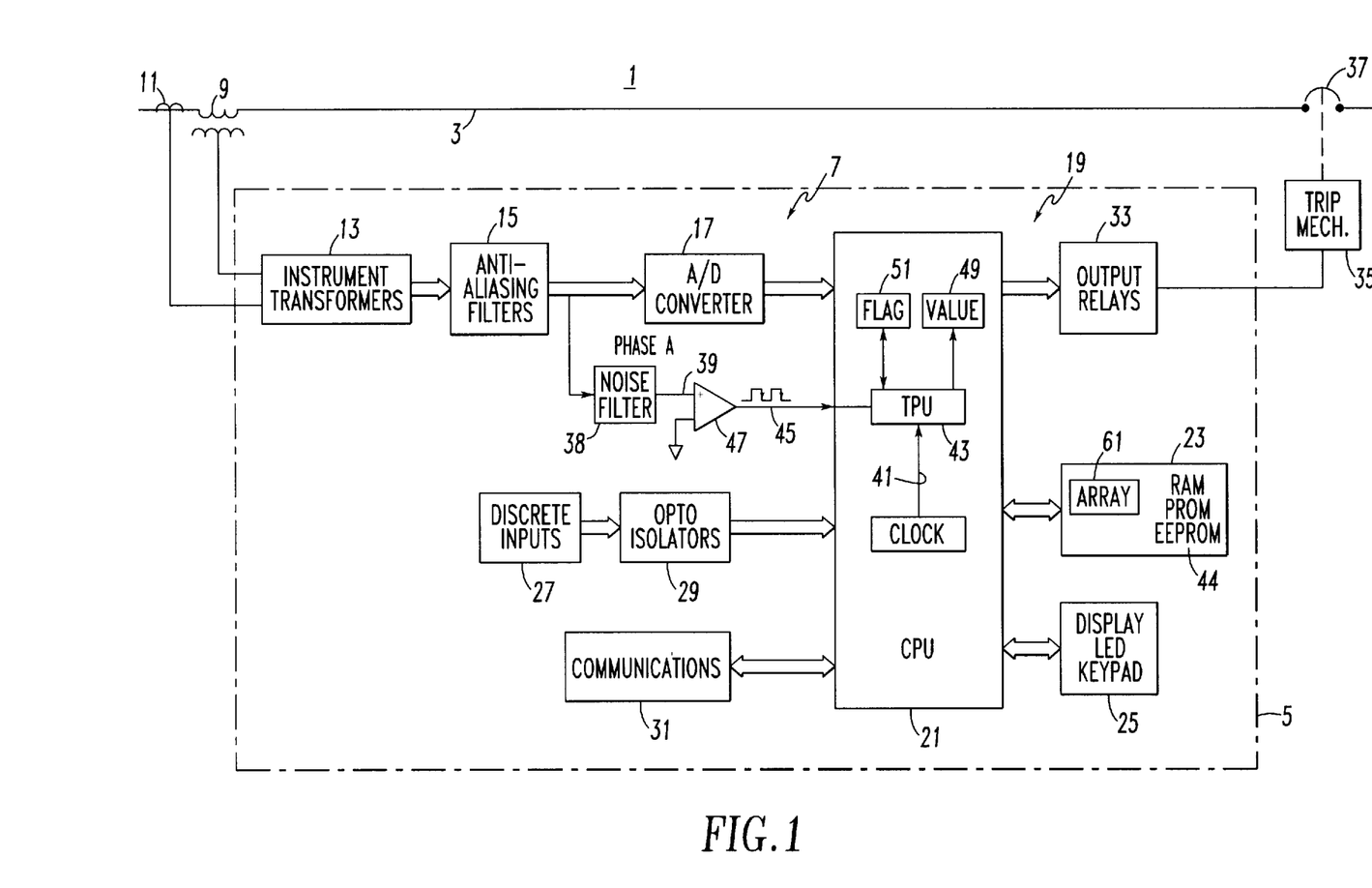
FIG. 1 is a schematic diagram of an electronic protective relay in accordance with the invention.

Referring to FIG. 1, the electric power system 1 to which the invention is applied includes a power line 3. While a single line representation of the power line 3 has been used in FIG. 1, the line can be single phase or multiphase, such as three-phase with or without a neutral. The exemplary protective relay 5 is a digital relay and includes a sensing circuit 7 for converting analog voltage and current inputs sensed by the potential transformer 9 and current transformer 11, respectively. Instrument transformers 13 reduce the high voltage and current to values that the electronic circuitry can accept and electrically isolate the relay 5 from the power system 1. Anti-aliasing filters 15 remove unwanted high frequency noise and satisfy the sampling requirement of the analog to digital (A/D) converter 17, which converts the analog signals to digital signals. A suitable microprocessor 19 inputs the digital signals and includes a central processing unit (CPU) 21 and memory 23 (e.g., RAM, PROM and/or EEPROM) which stores intermediate variables, program code and setting values. A man-machine interface 25 can include a display device along with a key pad or pushbuttons, which provide a mechanism of displaying metering values, to view and set settings, and to display other system data and status. The man-machine interface 25 also can include light emitting diodes (LEDs) which indicate system operation status. Discrete inputs 27 such as, for example, a remote trip signal, are input to the CPU 21 through optoisolators 29. If desired, a suitable communications interface 31 can be provided for interfacing the protective relay 5 with other devices on a network (not shown).

The protective relay 5 also includes output relays 33 which convey decisions generated within the protective relay based on the inputs and predefined conditions to the devices to be controlled. For instance, a trip relay can actuate a trip mechanism 35, which opens the main contacts 37 to interrupt the current in the power line 3.

The frequency of the AC signal(s) on the power line 3 is determined from the voltage of a single phase, such as, for example, the filtered voltage 39 of phase A. A current waveform could also be used for determining frequency; however, generally a voltage signal is employed, as it will generally be a more stable signal in a voltage sourced power system. As explained below in connection with FIG. 2, in accordance with the invention, the frequency estimation is based, initially, on a count of cycles of the CPU clock 41 between zero crossings of the filtered phase A voltage 39 as determined by the CPU time processor unit (TPU) 43.

Figure 2:
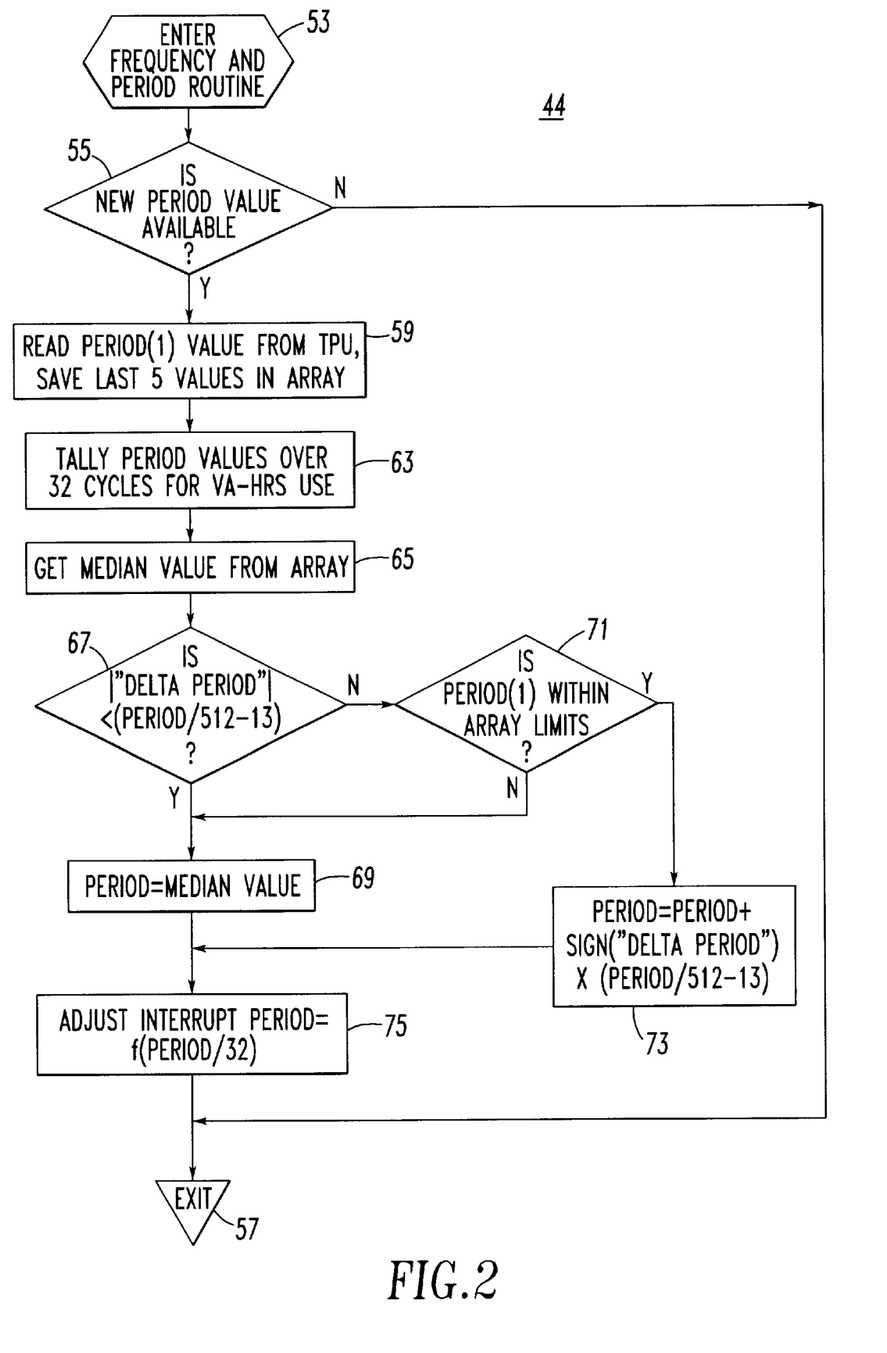
FIG. 2 is a flow chart of the program run by the electronic protective relay of FIG. 1 to implement the invention.

Referring to FIG. 2, a frequency and period routine 44 is shown. In turn, other routines (not shown) of the protective relay 5 employ frequency and/or period. For example, such routines may include one or more of power quality, load shedding, protection and/or metering and relay function routines.

In the exemplary embodiment, the CPU 21 of FIG. 1 is a Motorola MC68332 32-bit μP, although any suitable processor, microcomputer or microprocessor may be employed. The μP TPU 43 receives a digital signal 45 from a comparator 47. A suitable noise filter 38 filters the phase A voltage from the corresponding filter 15. The digital signal 45 represents the filtered phase A voltage 39 from the filters 15, 38. The TPU 43 counts clock cycles of the μP clock 41 and outputs the same in a count value register 49. In the exemplary embodiment, those clock cycles have a nominal period of about 1.6 μs, although any suitable clock and clock cycle period may be employed. The comparator 47 outputs the digital signal 45 having a logical "1" whenever the filtered phase A voltage 39 is positive and a logical "0" whenever the filtered phase A voltage 39 is negative. In turn, the TPU 43 detects zero crossings such as, for example, the positive to negative zero crossings of the filtered phase A voltage 39 (e.g., when the output of the comparator 47 transitions from logical "1" to logical "0"). In response to one of the positive to negative zero crossings of the filtered phase A voltage 39, the TPU 43 stores a new period count value in the register 49 and sets a flag 51. In turn, the μP 21 may read the period count value from the register 49 and reset the flag 51.

The μP 21 includes an interrupt (not shown), which interrupt nominally occurs 32 times per line cycle. As part of the interrupt service routine (not shown) for that interrupt, the μP 21 reads the various voltage and current values from the A/D converter 17 and provides those values to various metering and/or protection functions (not shown). The routine 44 of FIG. 2 is preferably called, at 53, from that interrupt service routine.

Next, at 55, it is determined whether a new count value is available from the TPU register 49 by reading the state of the TPU flag 51. If the flag 51 is reset, then the routine 44 exits at 57. On the other hand, if the flag 51 is set and the new TPU period count value is available, then, at 59, the μP 21 reads that new period count value from the register 49 and stores the same as the newest value, period(1), of the last five line cycle period measurements, period(1), period(2), period(3), period(4) and period(5), in a five-element array 61, period (n), in the memory 23 of FIG. 1. The oldest of the previous five line cycle period measurements in the five-element array 61 is discarded. For example, this may be accomplished by any suitable hardware or software FIFO structure. Alternatively, five memory transfers may be employed including transferring: (1) period(4) to period(5); (2) period (3) to period(4); (3) period(2) to period(3); (4) period(1) to period(2); and (5) the new count value from the register 49 to period(1) in the array 61. As indicated above, the μP 21 resets the flag 51 after the count value is read from the register 49. For example, for a nominal 60 Hz line cycle of the filtered phase A voltage 39 having a nominal 16.667 ms period between consecutive positive to negative zero crossings of the filtered phase A voltage 39, a count value of about 10,376 counts is obtained with the μP clock 41 having a period of about 1.6063 μs per count.

Although not part of and not required by the present invention, at 63, the new count value of period(1) is added to a tally value (not shown) for 32 line cycles for use in VA-hrs (metering) calculations (not shown).

Next, at 65, the median value (i.e., the middle value of the last five line cycle period measurements of the five-element array 61) is determined. For example, the last five line cycle period measurements may be, for example: 10,371, 10,373, 10,374, 10,376 and 10,378, as ordered from lowest value to highest value. In this example, the median value is 10,374, with it being understood that the median value may be in any one, some or all of the five elements, period(1), period(2), period(3), period(4) and period(5), of the five-element array 61.

Steps 67, 69 and 71 generally define a new line cycle period, $P_0$, based upon the median value of the array 61. The old line cycle period, $P_{-1}$, being defined by a previous execution of the routine 44 and, in particular, execution of one of: (1) steps 67 and 69; (2) steps 67, 71 and 69; or (3) steps 67, 71 and 73. In this example, $P_{-1}$, $P_0$, and $P_{+1}$ are consecutive line cycle periods that are determined after corresponding positive to negative zero crossings of the filtered phase A voltage 39.

First, at 67, it is determined whether the absolute value of the last line cycle period measurement, period(1), of the array 61 minus the old line cycle period, $P_{-1}$, is less than $P_{-1}/512-13$. This determination is shown in Equations 1 and 2:

$$|period(1)-P_{-1}| < P_{-1}/512-13 \quad \text{(Eq. 1)}$$

$$|delta\ period| < P_{-1}/512-13 \quad \text{(Eq. 2)}$$

wherein:

period(1) is the newest line cycle period measurement from the array 61;

$P_{-1}$ is the old line cycle period as determined by a previous execution of routine 44;

$|period(1)-P_{-1}|$ is the absolute value of: (period(1) minus $P_{-1}$);

512 and 13 are exemplary, although any suitable constants may be employed; and

"delta period" is period(1)–$P_{-1}$.

If the result of the test, at 67, is true, then the new line cycle period, $P_0$, is set equal to the median value at 69. On the other hand, if that test is false, then at 71, it is determined if the newest line cycle period measurement, period(1), is within the limits of the array 61. In particular, it is determined if period(1) is less than the maximum value, period $(n)_{MAX}$, of the five-element array 61, and is greater than the minimum value, period$(n)_{MIN}$, of such array 61.

For example, if the last five line cycle period measurements are, for example: 10,372, 10,374, 10,376, 10,377 and 10,379, as ordered from the lowest value to the highest value, then period$(n)_{MAX}$ is 10,379 and period$(n)_{MIN}$ is 10,372. Hence, in this example, if period(1) is 10,372 or less, or is 10,379 or more, then the test is not met and the new line cycle period, $P_0$, is set equal to the median array value (e.g., 10,376 in this example) at 69. Otherwise, if the old line cycle period, $P_{-1}$, is between 10,373 and 10,378, inclusive, then the test is met in this example and execution resumes at 73.

As indicated above, if period(1) is not within the limits of the array 61, then, the new line cycle period, $P_0$, is set equal to the median array value at 69. Otherwise, at 73, period(1) is within the limits of the array 61, and the new line cycle period, $P_0$, is set as shown in Equation 3:

$$P_0 = P_{-1} + \text{sign}(\text{delta period}) \times (P_{-1}/512-13) \quad \text{(Eq. 3)}$$

wherein:

$P_{-1}$ is the old line cycle period as determined by a previous execution of routine 44;

$P_0$ is the new line cycle period as determined by the current execution of routine 44;

sign(x) is equal to –1 if x is less than zero and is, otherwise, equal to +1;

"delta period" is period(1)–$P_{-1}$; and 512 and 13 are exemplary, although any suitable constants may be employed.

Hence, if period(1)–$P_{-1}$ (i.e., "delta period") is positive (i.e., period(1) is greater than $P_{-1}$), then the new line cycle period, $P_0$, is set equal to $P_{-1}$ plus ($P_{-1}/512-13$) (i.e., $P_{-1} \times (513/512)-13$). Otherwise, if period(1)–$P_{-1}$ (i.e., "delta period") is negative (i.e., period(1) is less than $P_{-1}$), then the new line cycle period, $P_0$, is set equal to $P_{-1}$ minus ($P_{-1}/512-13$) (i.e., $P_{-1} \times (511/512)+13$).

For example, if period(1) is 10,360, which is within the limits of the array 61 in this particular example, and if $P_{-1}$ is 10,375, in this example, then period(1)–$P_{-1}$ is negative (e.g., 10,360–10,375=–15), and the new line cycle period, $P_0$, is set equal to the old line cycle period, $P_{-1}$ (e.g., 10,375) minus ($P_{-1}/512-13$) (e.g., 10,375/512–13=about 7). This provides the new line cycle period, $P_0$, of 10,368 (e.g., about 10,375×(511/512)+13).

As another example, if period(1) is 10,390, which is within the limits of the array 61 in this particular example, and if $P_{-1}$ is 10,375, in this example, then period(1)–$P_{-1}$ is positive (e.g., 10,390–10,375=+15), and the new line cycle period, $P_0$, is set equal to the old line cycle period, $P_{-1}$ (e.g., 10,375) in this example plus ($P_{-1}/512-13$) (e.g., 10,375/512–13=about 7). This provides the new line cycle period, $P_0$, of 10,382 (e.g., about 10,375×(513/512)–13).

Although not part of and not required by the present invention, at 75, after either step 69 or step 73, the period of the interrupt (not shown) of the μP 21 is adjusted for the new line cycle period, $P_0$, divided by 32. For example, the count of the CPU clock 41 associated with the next interrupt, which occurs 32 times per line cycle, is set equal to the count of such clock associated with the previous interrupt plus $P_0/32$. After 75, the routine exits at 57.

As discussed above, the new line cycle period, $P_0$, is generally set, at 69, to be the median value of the five-element array 61. In this manner, even if the array 61 includes one or two abnormally high line cycle period measurements, and one or two abnormally low line cycle period measurements, then the new line cycle period, $P_0$, is suitably set with the median array value. The median array value has the higher probability of being the correct line cycle period value if the AC line frequency is not changing or is changing insignificantly.

Under circumstances where the newest line cycle period measurement, period(1), is significantly different from the old line cycle period, $P_{-1}$, as determined at 67, and where period(1) is within the limits of the array 61, as determined at 71, then the new line cycle period, $P_0$, is suitably set equal to $P_{-1} \pm (P_{-1}/512-13)$ at 73, as discussed above in connection with Equation 3. Although a calculation is shown, a suitable predetermined constant may be employed.

For example, for a nominal 60 Hz line cycle period of 10,368 counts, the magnitude of the exemplary adjustment is 7 counts (e.g., about 10,368/512–13). An adjustment of 7 counts corresponds to a frequency change between about 59.98 Hz to (or from) about 60.02 Hz.

Although a five-element array 61 is disclosed in connection with FIGS. 1 and 2, with a median value of such array being obtained at step 65, the invention is applicable to larger arrays, or to suitable hardware or software FIFO structures, in which five or more line cycle period measurements (e.g., period(1), period(2), ... period(m), wherein m is an integer, which is greater than or equal to five) are collected and employed to provide a median value or an average value as discussed below. As discussed above in connection with FIGS. 1 and 2, which employ the five-element array 61, a maximum value and a minimum value of the five line cycle period measurements are determined, and the period, and thus the frequency, is determined, at 69, based upon the median value of those line cycle period measurements, which excludes the two highest values and the two lowest values.

Figure 3:
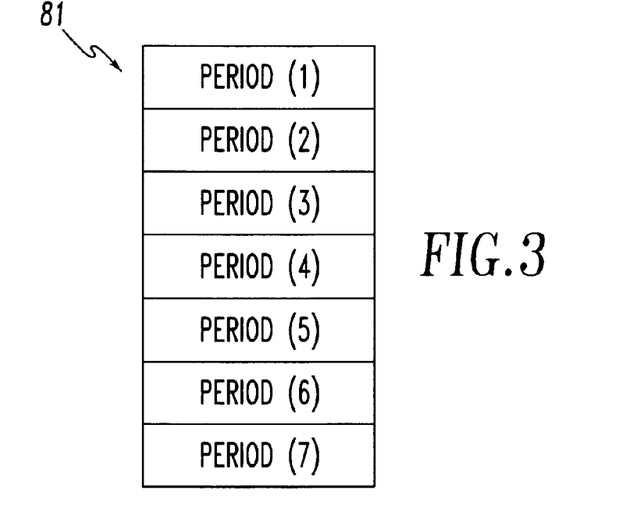
FIGS. 3 and 4 are block diagrams of memory arrays in accordance with other embodiments of the invention.

FIG. 3 shows a seven-element array 81, which collects the seven most recent line cycle period measurements (e.g., period(1), period(2), period(3), period(4), period(5), period(6) and period(7)). Similar to the five-element array 61 of FIG. 1, a median value is determined from the seven elements, and frequency is determined based upon the median value. For example, if the last seven line cycle period measurements are: 10,372, 10,373, 10,374, 10,375, 10,376, 10,377 and 10,378, then the median value is 10,375, and the frequency is determined by multiplying that count by the time per count (e.g., about 1.6063 μs per count) and inverting that result (e.g., about 60.0058 Hz).

Alternatively, an average of the middle three line cycle period measurements may be employed. For example, if the last seven line cycle period measurements are: 10,001, 10,755, 10,371, 10,374, 10,375, 10,376 and 10,378, then the three values closest the median are 10,374, 10,375 and 10,376, and the frequency is determined by averaging those values (e.g., to obtain 10,375), multiplying that average count by the time per count (e.g., about 1.6063 μs per count) and inverting that result (e.g., about 60.0058 Hz).

Figure 4:
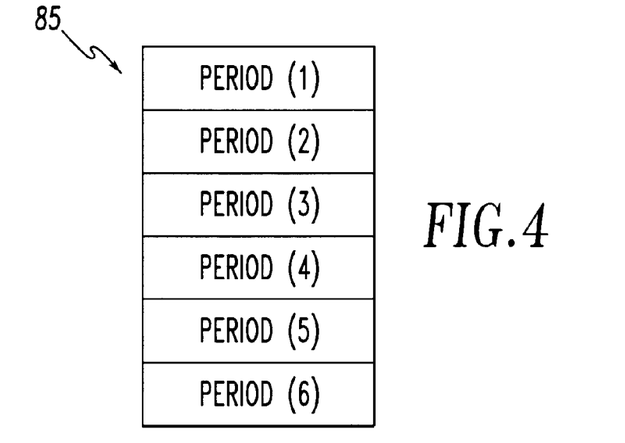

FIG. 4 shows a six-element array 85, which collects the six most recent line cycle period measurements (e.g., period (1), period(2), period(3), period(4), period(5) and period(6)). In this example, the two line cycle period measurements closest the median are determined, which excludes the two highest and the two lowest values. In turn, an average value is determined from the two (middle) values and the frequency is determined based upon the average value. For example, if the last six line cycle period measurements are: 10,001, 10,755, 10,002, 10,756, 10,377 and 10,378, then the two (middle) values are 10,377 and 10,378, and the frequency is determined by averaging those values (e.g., to obtain 10,377.5), multiplying that average count by the time per count (e.g., about 1.6063 μs per count) and inverting that result (e.g., about 59.9914 Hz).

In the foregoing examples for FIGS. 3 and 4, the average value is determined in place of the median value of step 65 of FIG. 2, and such average value is employed in place of the median value at step 69 of FIG. 2. Otherwise, except for possible changes to the size of the array 61 and corresponding changes to step 59 which stores values in the array, the routine 44 of FIG. 2 may be employed.

Although various array sizes are shown, relatively smaller array sizes are preferred in terms of efficient use of memory space, processor duty cycle and response to actual changes in frequency (or AC cycle period). As discussed above, array sizes of five (e.g., employing the median), six (e.g., employing the median or the average of the middle two values), seven (e.g., employing the median or the average of the middle three values), eight (e.g., employing the median or the average of the middle two or middle four values), nine (e.g., employing the median or the average of the middle three or middle five values), or greater element counts may be employed. Although an array size of four might be employed, it is believed that the median two values could provide an average of a proper measured period value and an improper measured period value, which is not desirable. Similarly, for array sizes of six or larger, if only the maximum value and the minimum value are excluded, then it could be possible to provide an average based upon an improper measured value.

The present invention provides high accuracy frequency metering using statistical techniques and quick acquisition of step changes in frequency for the exemplary protective relay 5.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

Want is claimed is:

1. An apparatus for determining frequency of an alternating current (AC) signal of an electric power system, said AC signal having a period between zero crossings thereof, said apparatus comprising:

means for measuring the period of said AC signal between one of said zero crossings and a subsequent one of said zero crossings to provide a measured period value; and a processor comprising:
a memory collecting at least five consecutive values of said measured period values, and
a routine choosing a median value from said measured period values and determining said frequency based upon said median value.

2. The apparatus of claim 1 wherein the routine of said processor further sets a new line cycle period equal to a previously determined line cycle period plus a function of the previously determined line cycle period.

3. The apparatus of claim 2 wherein said function of the previously determined line cycle period is the previously determined line cycle period divided by a first constant minus a second constant.

4. The apparatus of claim 1 wherein the routine of said processor further employs said median value to determine a new line cycle period if: (i) an absolute value of a difference between a last value of said measured period values and a previously determined line cycle period is less than a predetermined value; or (ii) said last value of said measured period values is greater than or equal to or less than or equal to all of said measured period values; and, otherwise, adjusts said previously determined line cycle period to determine said new line cycle period.

5. The apparatus of claim 4 wherein said routine predetermines said predetermined value from the previously determined line cycle period divided by a first constant minus a second constant.

6. A method for determining frequency of an alternating current (AC) signal of an electric power system, said AC signal having a period between zero crossings thereof, said method comprising:

measuring the period of said AC signal between one of said zero crossings and a subsequent one of said zero crossings to provide a measured period value;

collecting at least five consecutive values of said measured period values;

choosing a median value from the consecutive values of said measured period values; and determining said frequency based upon said median value.

7. The method of claim 6 further comprising employing said median value to determine a new line cycle period if:

(i) an absolute value of a difference between a last value of said measured period values and a previously determined line cycle period is less than a predetermined value; or (ii) said last value of said measured period values is greater than or equal to or less than or equal to all of said measured period values; and otherwise, adjusting said previously determined line cycle period to determine said new line cycle period.

8. A method for determining frequency of an alternating current (AC) signal of an electric power system, said AC signal having a period between zero crossings thereof, said method comprising:

measuring the period of said AC signal between one of said zero crossings and a subsequent one of said zero crossings to provide a measured period value;

collecting at least five of said measured period values;

determining at least two highest values of said measured period values;

determining at least two lowest values of said measured period values; and determining said frequency based upon said measured period values excluding said at least two highest values and said at least two lowest values.

9. The method of claim 8 further comprising employing an odd count of said measured period values.

10. The method of claim 9 further comprising employing five as said odd count of said measured period values;

determining a median value of said measured period values; and determining said frequency based upon said median value.

11. The method of claim 9 further comprising employing at least seven as said odd count of said measured period values;

determining a median value of said measured period values; and determining said frequency based upon said median value.

12. The method of claim 9 further comprising employing at least seven as said odd count of said measured period values;

determining three values closest to a median of said measured period values;

determining an average value of said three values; and determining said frequency based upon said average value.

13. The method of claim 9 further comprising determining an average value of said measured period values excluding said at least two highest values and said at least two lowest values; and determining said frequency based upon said average value.

14. The method of claim 9 further comprising determining a median value of said measured period values;

employing said median value to determine a new line cycle period if:

(i) an absolute value of a difference between a last value of said measured period values and a previously determined line cycle period is less than a predetermined value; or (ii) said last value of said measured period values is greater than or equal to or less than or equal to all of said measured period values; and otherwise, adjusting said previously determined line cycle period to determine said new line cycle period.

15. The method of claim 9 further comprising determining a median value of said measured period values;

employing said median value to determine a new line cycle period if:

(i) an absolute value of a difference between a last value of said measured period values and a previously determined line cycle period is less than a function of said previously determined line cycle period; or (ii) said last value of said measured period values is greater than or equal to or less than or equal to all of said measured period values; and otherwise, adjusting said previously determined line cycle period to determine said new line cycle period.

16. The method of claim 8 further comprising employing an even count of said measured period values.

17. The method of claim 16 further comprising employing at least six as said even count of said measured period values;

determining two values closest to a median of said measured period values;

determining an average value of said two values; and determining said frequency based upon said average value.

18. The method of claim 16 further comprising determining an average value of said measured period values excluding said at least two highest values and said at least two lowest values; and determining said frequency based upon said average value.

19. The method of claim 16 further comprising determining an average value of said measured period values excluding said at least two highest values and said at least two lowest values; and employing said average value to determine a new line cycle period if:

(i) an absolute value of a difference between a last value of said measured period values and a previously determined line cycle period is less than a predetermined value; or (ii) said last value of said measured period values is greater than or equal to or less than or equal to all of said measured period values; and otherwise, adjusting said previously determined line cycle period to determine said new line cycle period.

20. An apparatus for determining frequency of an alternating current (AC) signal of an electric power system, said AC signal having a period between zero crossings thereof, said apparatus comprising:

means for measuring the period of said AC signal between one of said zero crossings and a subsequent one of said zero crossings to provide a measured period value;

a processor comprising:

a memory collecting at least five consecutive values of said measured period values, a routine choosing a median value from said measured period values and determining said frequency based upon said median value; and wherein the routine of said processor further employs said median value to determine a new line cycle period if: (i) an absolute value of a difference between a last value of said measured period values and a previously determined line cycle period is less than a predetermined value; or (ii) said last value of said measured period values is greater than or equal to or less than or equal to all of said measured period values; and, otherwise, adjusts said previously determined line cycle period to determine said new line cycle period.

21. A method for determining frequency of an alternating current (AC) signal of an electric power system, said AC signal having a period between zero crossings thereof, said method comprising:

measuring the period of said AC signal between one of said zero crossings and a subsequent one of said zero crossings to provide a measured period value;

collecting at least five consecutive values of said measured period values;

choosing a median value from the consecutive values of said measured period values;

determining said frequency based upon said median value;

employing said median value to determine a new line cycle period if:

(i) an absolute value of a difference between a last value of said measured period values and a previously determined line cycle period is less than a predetermined value; or (ii) said last value of said measured period values is greater than or equal to or less than or equal to all of said measured period values; and otherwise, adjusting said previously determined line cycle period to determine said new line cycle period.

22. A method for determining frequency of an alternating current (AC) signal of an electric power system, said AC signal having a period between zero crossings thereof, said method comprising:

measuring the period of said AC signal between one of said zero crossings and a subsequent one of said zero crossings to provide a measured period value;

collecting at least five of said measured period values;

determining at least two highest values of said measured period values;

determining at least two lowest values of said measured period values;

determining said frequency based upon said measured period values excluding said at least two highest values and said at least two lowest values;

employing an odd count of said measured period values;

determining a median value of said measured period values;

employing said median value to determine a new line cycle period if:

(i) an absolute value of a difference between a last value of said measured period values and a previously determined line cycle period is less than a predetermined value; or (ii) said last value of said measured period values is greater than or equal to or less than or equal to all of said measured period values; and otherwise, adjusting said previously determined line cycle period to determine said new line cycle period.

23. A method for determining frequency of an alternating current (AC) signal of an electric power system, said AC signal having a period between zero crossings thereof, said method comprising:

measuring the period of said AC signal between one of said zero crossings and a subsequent one of said zero crossings to provide a measured period value;

collecting at least five of said measured period values;

determining at least two highest values of said measured period values;

determining at least two lowest values of said measured period values;

determining said frequency based upon said measured period values excluding said at least two highest values and said at least two lowest values;

employing an even count of said measured period values;

determining an average value of said measured period values excluding said at least two highest values and said at least two lowest values;

employing said average value to determine a new line cycle period if:

(i) an absolute value of a difference between a last value of said measured period values and a previously determined line cycle period is less than a predetermined value; or (ii) said last value of said measured period values is greater than or equal to or less than or equal to all of said measured period values; and otherwise, adjusting said previously determined line cycle period to determine said new line cycle period.

24. An apparatus for determining frequency of an alternating current (AC) signal of an electric power system, said AC signal having a period between zero crossings thereof, said apparatus comprising:

means for measuring the period of said AC signal between one of said zero crossings and a subsequent one of said zero crossings to provide a measured period value;

a processor comprising:
  a memory collecting at least five consecutive values of said measured period values;
  a routine choosing a median value from said measured period values and determining said frequency based upon said median value;
  wherein the routine of said processor further employs said median value to determine a new line cycle period if: (i) an absolute value of a difference between a last value of said measured period values and a previously determined line cycle period is less than a predetermined value; or (ii) said last value of said measured period values is greater than or equal to said predetermined value and is not within array limits;
  wherein said array limits are determined by the maximum and minimum values of N consecutive median values where N is an integer; and
  otherwise, adjusts said previously determined line cycle period to determine said new line cycle period.

25. An apparatus for determining frequency of an alternating current (AC) signal of an electric power system, said AC signal having a period between zero crossings thereof, said apparatus comprising:
  means for measuring the period of said AC signal between one of said zero crossings and a subsequent one of said zero crossings to provide a measured period value;
  a processor comprising:
    a memory collecting at least five consecutive values of said measured period values;
    a routine choosing a median value from said measured period values and determining said frequency based upon said median value;
    wherein the routine of said processor further employs said median value to determine a new line cycle period if: (i) an absolute value of a difference between a last value of said measured period values and a previously determined line cycle period is less than a predetermined value; or (ii) said last value of said measured period values is greater than or equal to said predetermined value and is not within array limits; and
    wherein said array limits are determined by the maximum and minimum values of N consecutive median values where N is an integer.

26. An apparatus for determining frequency of an alternating current (AC) signal of an electric power system, said AC signal having a period between zero crossings thereof, said apparatus comprising:
  means for measuring the period of said AC signal between one of said zero crossings and a subsequent one of said zero crossings to provide a measured period value;
  a processor comprising:
    a memory collecting N consecutive values of said measured period values where N is greater than one and odd;
    a routine choosing a median value from said measured period values and determining said frequency based upon said median value;
    wherein the routine of said processor further employs said median value to determine a new line cycle period if: (i) an absolute value of a difference between a last value of said measured period values and a previously determined line cycle period is less than a predetermined value; or (ii) said last value of said measured period values is greater than or equal to said predetermined value and is not within array limits;
    wherein said array limits are determined by the maximum and minimum values of N consecutive median values, where N is an integer; and
    otherwise, adjusts said previously determined line cycle period to determine said new line cycle period.

27. An apparatus for determining frequency of an alternating current (AC) signal of an electric power system, said AC signal having a period between zero crossings thereof, said apparatus comprising:
  means for measuring the period of said AC signal between one of said zero crossings and a subsequent one of said zero crossings to provide a measured period value;
  a processor comprising:
    a memory collecting N consecutive values of said measured period values where N is greater than one and odd;
    a routine choosing a median value from said measured period values and determining said frequency based upon said median value;
    wherein the routine of said processor further employs said median value to determine a new line cycle period if: (i) an absolute value of a difference between a last value of said measured period values and a previously determined line cycle period is less than a predetermined value; or (ii) said last value of said measured period values is greater than or equal to or less than or equal to said predetermined value and is not within array limits; and
    wherein said array limits are determined by the maximum and minimum values of N consecutive median values, where N is an integer.

28. An apparatus for determining frequency of an alternating current (AC) signal of an electric power system, said AC signal having a period between zero crossings thereof, said apparatus comprising:
  means for measuring the period of said AC signal between one of said zero crossings and a subsequent one of said zero crossings to provide a measured period value;
  a processor comprising:
    a memory collecting N consecutive values of said measured period values where N is greater than one and odd, and
    a routine choosing a median value from said measured period values and determining said frequency based upon said median value.

* * * * *